United States Patent
Bradley

(10) Patent No.: US 6,838,956 B2
(45) Date of Patent: Jan. 4, 2005

(54) PACKAGING METHODOLOGY FOR DUPLEXERS USING FBARS

(75) Inventor: Paul Bradley, Mountain View, CA (US)

(73) Assignee: Agilent Technologies, Inc, Palo Alto, CA (US)

( * ) Notice: Subject to any disclaimer, the term of this patent is extended or adjusted under 35 U.S.C. 154(b) by 37 days.

(21) Appl. No.: 10/243,144

(22) Filed: Sep. 13, 2002

(65) Prior Publication Data

US 2003/0011446 A1 Jan. 16, 2003

Related U.S. Application Data

(63) Continuation-in-part of application No. 09/702,499, filed on Oct. 31, 2000, now abandoned.

(51) Int. Cl.[7] .............................. H03H 9/54; H03H 9/58
(52) U.S. Cl. ........................ 333/189; 333/187; 310/321
(58) Field of Search ................................ 333/187, 189, 333/190; 310/320, 321

(56) References Cited

U.S. PATENT DOCUMENTS 4,112,147 A * 9/1978 Thompson .................. 427/100
5,162,822 A * 11/1992 Wakamori ................... 333/193
6,262,637 B1 * 7/2001 Bradley et al. .............. 333/133
6,377,137 B1 * 4/2002 Ruby .......................... 333/189

FOREIGN PATENT DOCUMENTS

JP          10-178327 A * 6/1998    .......... H03H/9/145

* cited by examiner

*Primary Examiner*—Robert Pascal
*Assistant Examiner*—Dean Takaoka

(57) ABSTRACT

A filter assembly includes a ceramic substrate. A die including a film bulk acoustic resonator receive-band filter, positioned on the ceramic substrate, having an input and an output, includes a plurality of film bulk acoustic resonators. The filter assembly includes a first and a second loop of current. The first loop includes a first wire bond connected to the input of the die, and a second wire bond connected to a first one of the plurality of film bulk acoustic resonators. The second loop includes a third wire bond connected to the output of the die, and a fourth wire bond connected to a second one of the plurality of film bulk acoustic resonators, wherein the first loop induces parasitic current in the second loop. The first and the second wire bonds are positioned proximate to one another to minimize the area of the first loop, and the third and the fourth wire bonds are positioned proximate to one another to minimize the area of the second loop.

22 Claims, 3 Drawing Sheets

US 6,838,956 B2

PACKAGING METHODOLOGY FOR DUPLEXERS USING FBARS

CROSS REFERENCE TO RELATED APPLICATIONS

This is a continuation-in-part of U.S. application Ser. No. 09/702,499, filed Oct. 31, 2000 now abandoned, entitled A PACKAGING METHODOLOGY FOR DUPLEXERS USING FBARS.

THE FIELD OF THE INVENTION

The invention relates to electronic components and, in particular, to electronic components used in high-power radio-frequency circuits.

BACKGROUND OF THE INVENTION

In many different communications applications, a common signal path is coupled both to the input of a receiver and to the output of a transmitter. For example, in a transceiver, such as a cellular or cordless telephone, an antenna may be coupled to the input of the receiver and to the output of the transmitter. In such an arrangement, a duplexer is used to couple the common signal path to the input of the receiver and to the output of the transmitter. The duplexer provides the necessary coupling while preventing the modulated transmit signal generated by the transmitter from being coupled from the antenna back to the input of the receiver and overloading the receiver.

FIG. 1 shows a conventional front-end circuit 10 such as that used in a cellular telephone, personal communication system (PCS) device or other transmit/receive apparatus. The output of the power amplifier 12 of the transmitter 14 and the input of the low-noise amplifier 16 of the receiver 18 are connected to the duplexer 20, which is a full duplexer. Also connected to the duplexer is the antenna 22.

A typical duplexer, such as duplexer 20, is a three-port device having a transmit port 24, a receive port 26, and an antenna port 28. The antenna port 28 is connected to the transmit port 24 through a first band-pass filter 30 and to the receive port 26 through the series arrangement of a 90° phase shifter 34 and a second band-pass filter 32. The pass bands of the first and second band-pass filters 30 and 32 are respectively centered on the frequency range of the transmit signal generated by the transmitter 14 and that of the receive signals to which the receiver 18 can be tuned. In the example shown in FIG. 1, the band-pass filters are configured such that the high-frequency stop band of the first band-pass filter 30 overlaps the pass-band of the second band-pass filter 32, and the low-frequency stop band of the second band-pass filter 32 overlaps the pass-band of the first band-pass filter 30.

The requirements for the first and second band-pass filters 30 and 32 are quite stringent. The band-pass filters isolate the very weak receive signal generated by the antenna 22 and fed to the input of the low-noise amplifier 16 from the strong transmit signal generated by the power amplifier 12. In a typical embodiment, the sensitivity of the low noise amplifier 16 is about −100 dBm, and the power amplifier 12 can feed power levels of about 28 dBm into the duplexer 20. In this situation, the duplexer 20 attenuates the transmit signal by about 50 dB between the antenna port 28 and the receive port 26 to prevent the residual transmit signal mixed with the receive signal at the receive port 26 from overloading the low-noise amplifier 16.

Duplexer 20 may be used in a personal communication system (PCS) using Code Division Multiple Access (CDMA). CDMA-PCS devices operate in frequency bands at about 1.9 GHz and impose especially stringent requirements on the duplexer performance. The guard band between the portions of the spectrum assigned to the transmit signal and the receive signal is only about 1% of the carrier frequency, i.e. 20 MHz. The bandwidth of the portions of the spectrum assigned to the transmit signal and the receive signal are about 3% of the carrier frequency, i.e. 60 MHz. This means that the band-pass filters are required to have an extremely sharp roll-off. FIG. 2 illustrates the basic arrangement of the transmit and receive bands. The characteristics of the band-pass filters 30 and 32 are identified by reference numbers 36 and 38, respectively, in FIG. 2.

When film bulk acoustic resonators (FBARs) are used in these high quality electronic filters, the performance is sensitive to small amounts of undesired coupling between connections between filter chip and the printed circuit board. These undesired couplings occur on the chip, in the wire-bonds connecting the package to the chip, and in the package itself. In a PCS duplexer, mutual inductances of approximately 1 picoHenry produce noticeable degradation of performance, particularly in the steep transition from pass-band to the reject-band just below pass-band.

SUMMARY OF THE INVENTION

One form of the present invention provides a filter assembly including a ceramic substrate. A die including a film bulk acoustic resonator receive-band filter, positioned on the ceramic substrate, having an input and an output, includes a plurality of film bulk acoustic resonators. The filter assembly includes a first and a second loop of current. The first loop includes a first wire bond connected to the input of the die, and a second wire bond connected to a first one of the plurality of film bulk acoustic resonators. The second loop includes a third wire bond connected to the output of the die, and a fourth wire bond connected to a second one of the plurality of film bulk acoustic resonators, wherein the first loop induces parasitic current in the second loop. The first and the second wire bonds are positioned proximate to one another to minimize the area of the first loop, and the third and the fourth wire bonds are positioned proximate to one another to minimize the area of the second loop.

DESCRIPTION OF THE PREFERRED EMBODIMENTS

Figure 1:
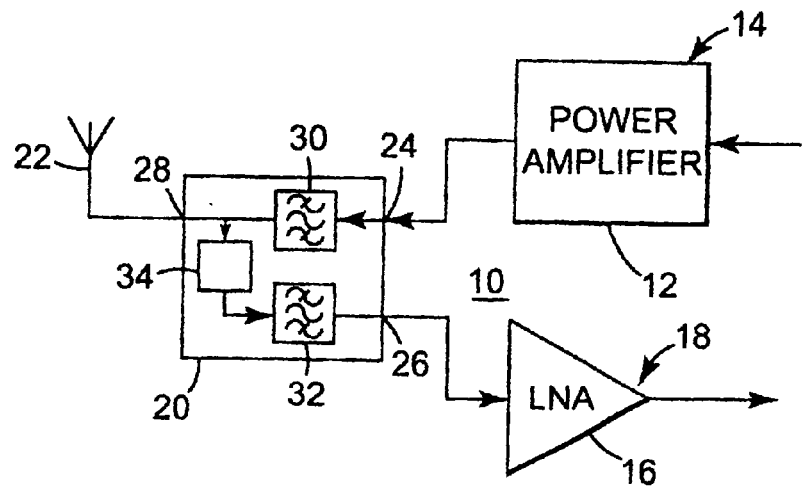
FIG. 1 illustrates a prior art PCS-duplexer.
Figure 2:
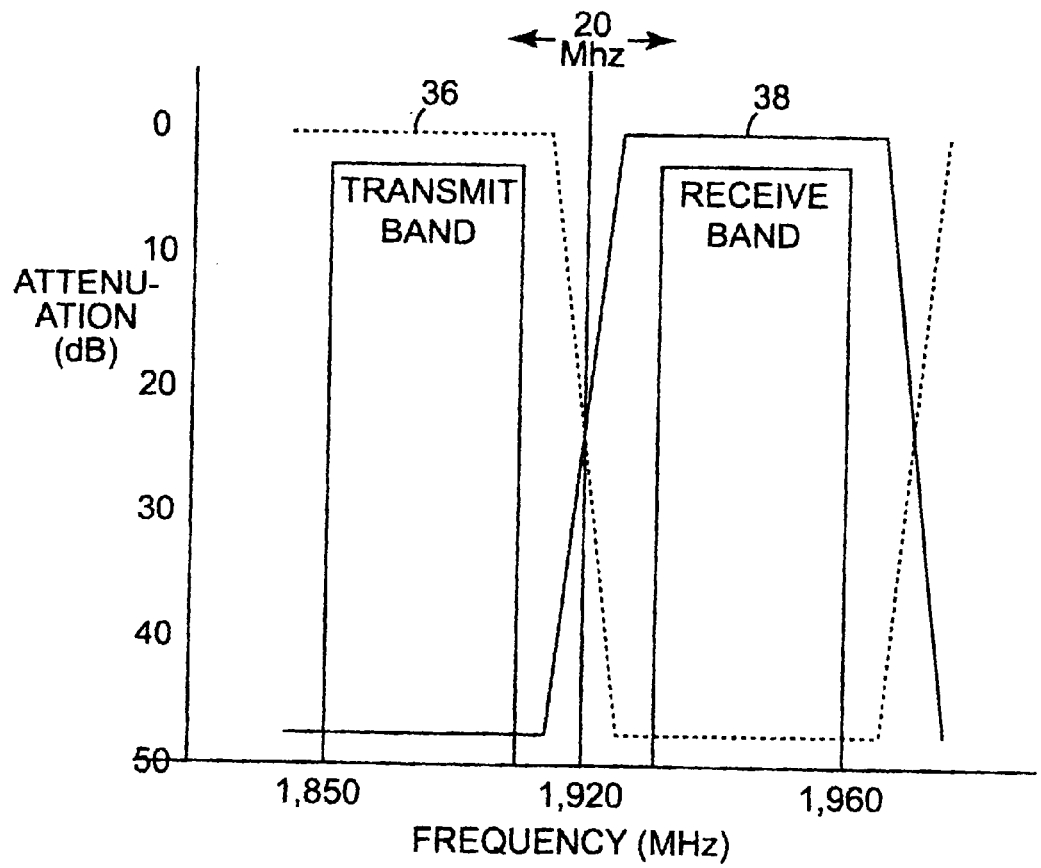
FIG. 2 illustrates the characteristics of the band-pass filters shown in FIG. 1.
Figure 3:
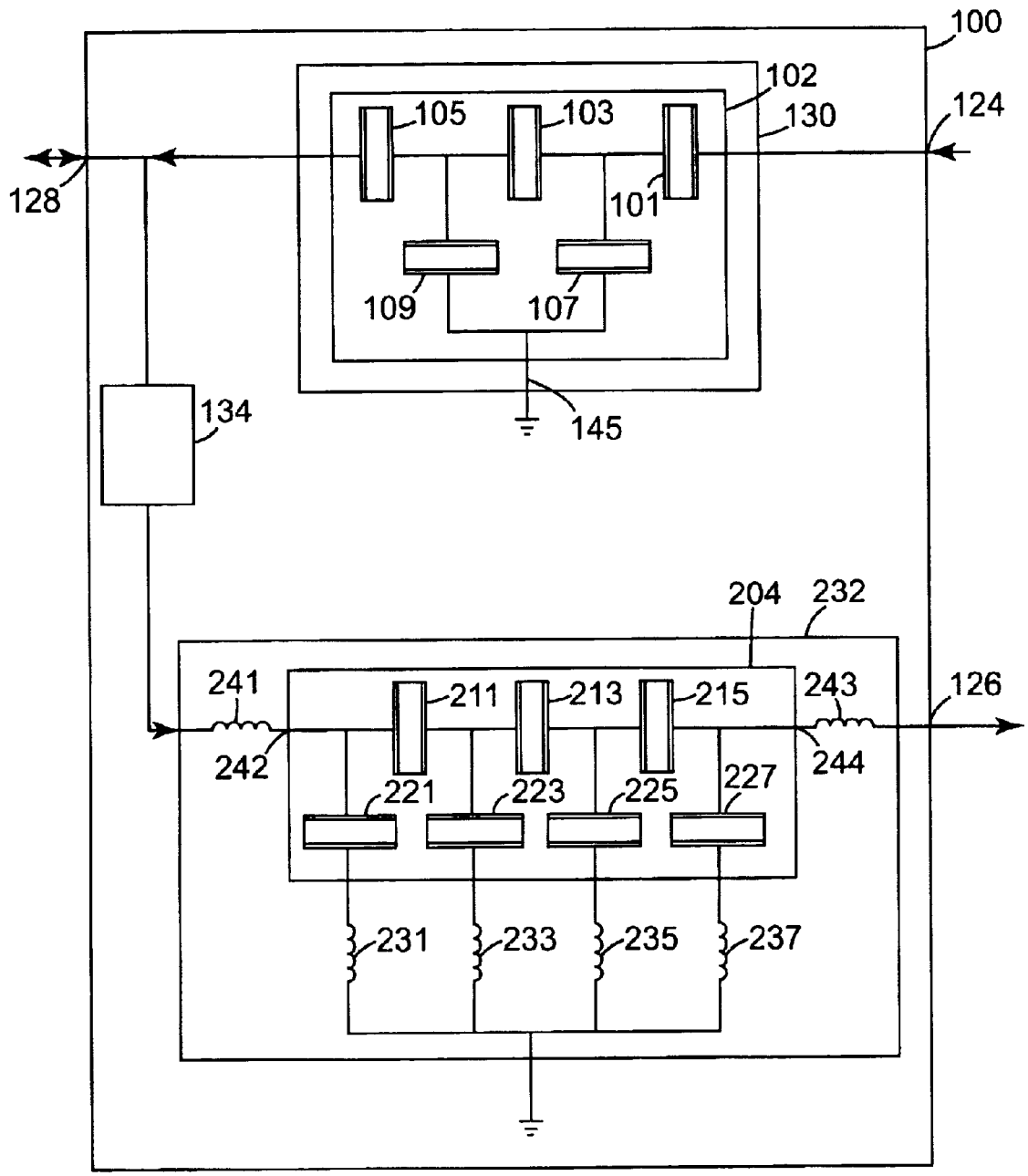
FIG. 3 illustrates a schematic layout of a PCS duplexer.

In U.S. Pat. No. 6,262,637 B1, entitled "DUPLEXER INCORPORATING THIN-FILM BULK ACOUSTIC RESONATORS (FBARS)", filed Jun. 2, 1999, issued Jul. 17, 2001, and assigned to the assignee of this disclosure, film bulk acoustic resonators (FBARs) were described for use with a personal communication system (PCS) duplexer. FIG. 3 shows a PCS duplexer 100. The duplexer 100 includes a transmit port 124, a receive port 126, an antenna port 128, a 90° phase shifter 134, a transmit band-pass filter 130 that includes a transmit FBAR array 102, and a receive band-pass filter 232 that includes a receive FBAR array 204. The transmit port 124 is connected to the antenna port 128 through the transmit band-pass filter 130. The antenna port 128 is connected to the receive port 126 through the series arrangement of the 90° phase shifter 134 and the receive band-pass filter 232.

The transmit band-pass filter 130 is composed of an integrated transmit FBAR array 102. The FBARs in array 102 are manufactured on a common piezoelectric layer. The transmit FBAR array 102 is composed of series FBARs 101, 103, 105 and shunt FBARs 107, 109, connected to form a ladder circuit. The series FBARs 101, 103, and 105, are connected in series between the transmit port 124 and the antenna port 128, the shunt FBAR 107 is connected between ground 145 and the node between the series FBARs 101, 103, and the shunt FBAR 109 is connected between ground 145 and the node between the series FBARs 103, 105. FIG. 3 illustrates a 2½-stage ladder circuit. The transmit FBAR array 102 may include any number of full stages, each composed of one series FBAR and one shunt FBAR. The number of ½ stages depends upon the desired filter characteristics of the transmit band-pass filter 130 and the characteristics of the individual FBARs constituting the transmit FBAR array 102.

The receive band-pass filter 232 is composed of an integrated receive FBAR array 204 having an input 242 and an output 244, series auxiliary inductors 241, 243, and shunt auxiliary inductors 231, 233, 235, and 237. The FBARs in array 204 are manufactured on a common piezoelectric layer. The receive FBAR array 204 is composed of series FBARs 211, 213, and 215 and shunt FBARs 221, 223, 225, and 227, connected to form a ladder circuit. The series auxiliary inductor 241, the series FBARs 211, 213, and 215, and the series auxiliary inductor 243 are connected in series between the end of the 90° phase shifter 134 remote from the antenna port 128 and the receive port 126. The shunt FBAR 221 and the shunt auxiliary inductor 231 are connected in series between ground and the node between the series auxiliary inductor 241 and the series FBAR 211. The shunt FBAR 223 and the shunt auxiliary inductor 233 are connected in series between ground and the node between the series FBARs 211 and 213. The shunt FBAR 225 and the shunt auxiliary inductor 235 are connected in series between ground and the node between the series FBARs 213 and 215. The shunt FBAR 227 and the shunt auxiliary inductor 237 are connected in series between ground and the node between the series FBAR 215 and the series auxiliary inductor 243. FIG. 3 illustrates a 3½ stage ladder circuit. The number of full stages and the number of half stages depends upon the desired filter characteristics of the receive band pass filter 232 and the characteristics of the individual FBARs constituting the receive FBAR array 204.

In a CDMA-PCS duplexer, the receive band-pass filter 232 should attenuate the transmit signal at the antenna port 128 to such a low level that the residual transmit signal mixed with the receive signal at the receive port 126 does not overload the highly sensitive low noise amplifier of the receiver connected to the receive port 126. Consequently, the transmit signal rejection requirements of the receive band-pass filter 232 are considerably more stringent than the receive signal rejection requirements of the transmit band-pass filter 130. To provide the desired filter characteristics for the receive band-pass filter 232, not all of the shunt FBARs 221, 223, 225, and 227, in the receive FBAR array 204 should have the same resonant frequency.

Each auxiliary inductance in receive band-pass filter 232 has two main effects, mainly to slightly reduce the frequency of the series resonance of the corresponding FBAR, and to introduce an additional series resonance. The auxiliary inductance has a negligible effect on the frequency of the parallel resonance. Hence, each auxiliary inductor "tunes" the corresponding FBAR. Unfortunately, the auxiliary inductors, particularly the shunt auxiliary inductors, not only affect the FBARs, but each other, particularly after packaging.

Film bulk acoustic resonators when used in electronic filters are prone to small shifts in resonant frequency as a result of inductances in the ground paths. These inductances can create undesirable electrical and/or physical characteristics that affect performance. One embodiment of the present invention addresses the undesired coupling between the package and a filter chip that uses film bulk acoustic resonators. One form of the present invention provides a physical layout of the filter and package to minimize this degradation in performance.

As described in further detail below, a die that includes an FBAR receive-band filter with a plurality of FBARs is positioned on a ceramic substrate including a ground plane through a die-attach paddle electrically connected to the ground plane. A victimizer and a victim loop of current are formed after packaging. The victimizer loop includes the input of the die and ceramic substrate. The victim loop includes the output of the die and ceramic substrate. During operation, the victimizer loop can induce parasitic current in the victim loop.

The parasitic current is minimized in several ways. In one embodiment, the wire-bonds and bond pads in the victimizer loop are positioned proximate to one another, and the wire-bonds and bond pads in the victim loop are positioned proximate to one another, to minimize mutual inductance. In one form of the invention, the wire-bonds, bond pads, and pins of the victimizer loop are spaced apart from the wire-bonds, bond pads, and pins of the victim loop. In one embodiment, the area of each of the current loops is minimized and the current loops are placed as far apart as possible in the package while maintaining connectivity for the chip. In one embodiment, the current loops are perpendicular to one another.

Figure 4A:
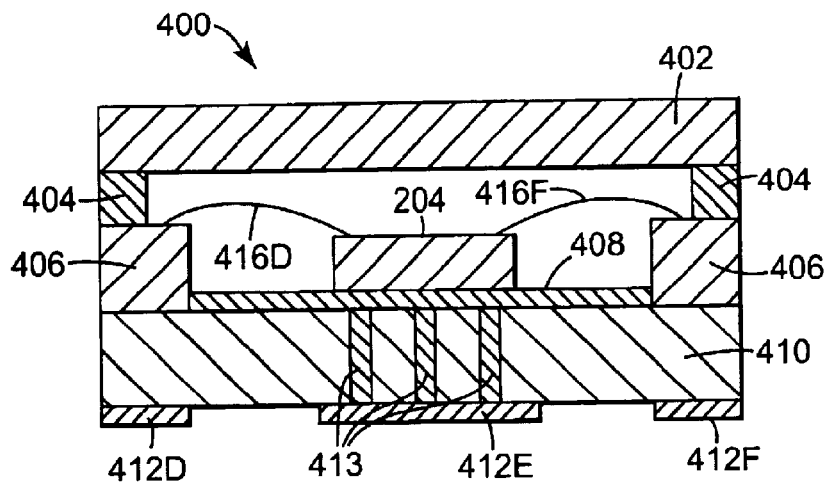
FIG. 4A illustrates a cross-sectional view of a packaging assembly for the receive FBAR array shown in FIG. 3 according to one embodiment of the present invention.

FIG. 4A illustrates a cross-sectional view of a packaging assembly or filter assembly 400 for the receive FBAR array 204 shown in FIG. 3 according to one embodiment of the present invention. Solder lands (pins) 412D, 412E, and 412F are formed on a bottom surface of a ceramic substrate layer 410. Solder land 412E is also referred to as ground plane 412E. A metallic die attach paddle 408 is formed on a top surface of ceramic layer 410. Die attach paddle 408 is electrically connected to ground plane 412E with a plurality of metallic vias 413 that are formed in ceramic layer 410. In one embodiment, vias 413 include nine cylindrical vias in a three-by-three array. Ceramic layer 406 is formed near the outer edges of the top surface of ceramic layer 410. Ceramic spacer layer 404 is formed on a top surface of ceramic layer 406. Ceramic lid 402 is formed on a top surface of ceramic spacer layer 404. In one embodiment, layers 402, 404, 406, and 410 are $Al_2O_3$.

Integrated receive FBAR array (also referred to as receive band filter chip) 204 is positioned on top of die attach paddle 408. In one embodiment, chip 204 includes seven FBARs configured as shown in FIG. 3. Wire-bonds (e.g., wire-bonds 416D and 416F) extend from the chip 204 to corresponding wire-bond pads 418 (shown in FIG. 4B) positioned on a top surface of the ceramic layer 406.

Figure 4B:
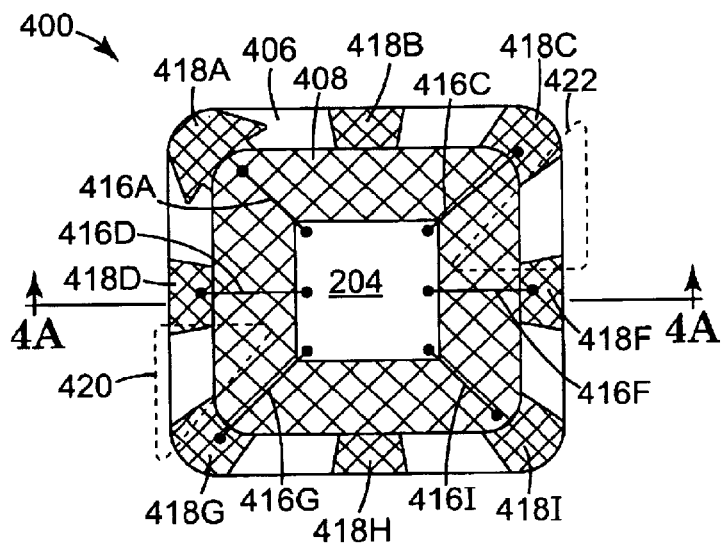
FIG. 4B illustrates a top view of the interior of the packaging assembly shown in FIG. 4A according to one embodiment of the present invention.

FIG. 4B illustrates a top view of the interior of the packaging assembly 400 shown in FIG. 4A according to one embodiment of the present invention. FIG. 4B includes section lines 4A—4A, which illustrate the view of FIG. 4A. As shown in FIG. 4B, a plurality of wire-bond pads 418A—418I (collectively referred to as wire-bond pads 418) are formed on ceramic layer 406. Wire-bond pads 418A, 418B, 418H, and 418I, are not used in one embodiment of assembly 400. A plurality of wire-bonds 416A, 416C, 416D, 416F, 416G, and 416I are coupled to chip 204 and extend outward from chip 204 as shown in FIG. 4B. In one embodiment, wire-bonds 416C, 416D, 416F, and 416G, are coupled to wire-bond pads 418C, 418D, 418F, and 418G, respectively, and wire-bonds 416A and 416I are coupled to die attach paddle 408.

In one form of the invention, wire-bonds 416A, 416C, 416G, and 416I are coupled to shunt FBARs 223, 227, 221, 225 (shown in FIG. 3), respectively, within chip 204. In one embodiment, wire-bonds 416A and 416I provide the series inductance (represented by inductors 233 and 235 in FIG. 3) for FBARs 223 and 225, respectively. In one embodiment, wire-bonds 416C and 416G provide a portion of the series inductance (represented by inductors 237 and 231) for FBARs 227 and 221, respectively, with the remaining series inductance being provided by conductive traces in a print circuit board (PCB) on which assembly 400 is mounted. Wire-bond 416D couples the input 242 of chip 204 with wire-bond pad 418D. Wire-bond 416F couples the output 244 of chip 204 to wire-bond pad 418F.

Figure 4C:
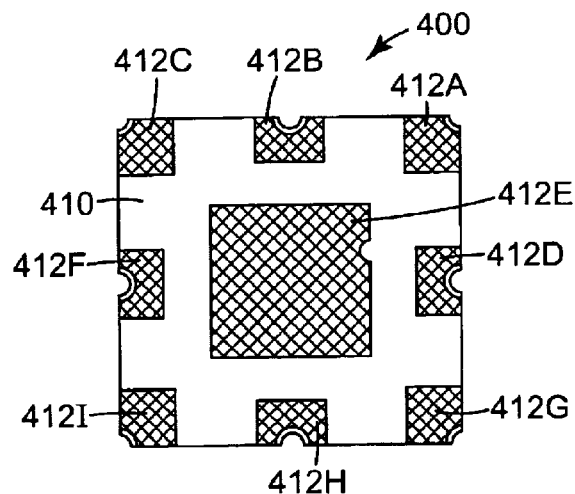
FIG. 4C illustrates a bottom view of the packaging assembly shown in FIG. 4A according to one embodiment of the present invention.

FIG. 4C illustrates a bottom view of the packaging assembly 400 shown in FIG. 4A according to one embodiment of the present invention. As shown in FIG. 4C, solder lands (pins) 412A–412I (collectively referred to as pins 412) are formed on a bottom surface of ceramic layer 410. In one embodiment, pins 412A–412I are electrically connected to pads 418A–418I, respectively, via conductors (not shown) that extend through ceramic layers 410 and 406. Pins 412A, 412B, 412H, and 412I are not used in one embodiment of assembly 400. Pin 412C is electrically connected to FBAR 227 in chip 204 via pad 418C and wire-bond 416C, and is configured to be connected to a grounded PCB conductive trace that provides a portion of the series inductance represented by inductor 237. Pin 412D is an input pin that is connected to the input 242 of chip 204 via pad 418F and wire-bond 416F. Pin 412E is a ground pin for connecting to the ground plane of a PCB. Pin 412E is coupled to die attach paddle 408. Pin 412F is an output pin that is connected to the output 244 of chip 204 via pad 418F and wire-bond 416F. Pin 412G is electrically connected to FBAR 221 in chip 204 via pad 418G and wire-bond 416G, and is configured to be connected to a grounded PCB conductive trace that provides a portion of the series inductance represented by inductor 231.

Referring again to FIG. 4B, within assembly 400, there are two current loops: victimizer current loop 420 and victim current loop 422. The victimizer loop 420, shown as a dashed line in FIG. 4B, includes wire-bonds 416D and 416G and bond pads 418D and 418G, and carries a large amount of current from the filter chip input 242 to ground. The victim loop 422, also shown as a dashed line in FIG. 4B, includes wire-bonds 416C and 416F and bond pads 418C and 418F, and preferably carries a small amount of current from the filter chip output 244 to ground. The victim loop 422 is susceptible to magnetic fields over time. The victimizer loop 420 can induce parasitic current in the victim loop.

To minimize the parasitic current, the area of either current loop 420 or 422 may be minimized. However, optimum results are achieved when the areas of both current loops 420 and 422 are minimized. In one embodiment, the areas of the loops 420 and 422 are minimized by positioning the wire-bonds 416 in the respective loops close together and minimizing the length of the wire-bonds 416. The current loops 420 and 422 are placed close to the grounded die attach paddle 408 to minimize the mutual inductance between the loops. As shown in FIG. 4B, the area of the victim and victimizer loops 422 and 420 are minimized and the loops are placed as far apart as possible from one another in the package 400. The pair of wire-bonds 416G and 416I and the pair of wire-bonds 416A and 416C are perpendicular to each other for maximum isolation. The wire-bonds 416A, 416C, 416G, and 416I, which are coupled to the shunt resonators in chip 204, are at perpendicular angles to one another so they do not couple very much. In addition, the loops 420 and 422 should be as far apart as possible to minimize coupling. For pin isolation, the distance between the "victim" pins 412C and 412F and the "victimizer" pins 412D and 412G should be maximized.

The parasitic current may be further controlled by the layout of the victimizer loop 420. The receive band filter chip 204 is preferably laid out such that the two shunts farthest apart in the filter (i.e., shunts 221 and 227) are physically the farthest apart (e.g., on opposing corners of chip 204). Ideally, all the pins 412 are far apart, but it is most critical that pins 412G and 412C are the farthest apart.

The distance of the current paths in assembly 400 from ground (e.g., distance of the current paths from die attach paddle 408 and from ground plane 412E) should be minimized to keep the mutual inductance low. Furthermore, the ground inductance of the metal paddle 408 should be minimized. The mutual inductance between leads connecting the assembly 400 to a PCB can be minimized when there is a short wire bond to the die-attach paddle 408.

Referring again to FIG. 4A, the top surface of ceramic layer 406 is about even with the top surface of chip 204, so the wire-bonds 416 can be relatively short. In addition, wire-bonds 416 are positioned close to die attach paddle 408, which is metalized and has a relatively large area to provide a good ground for reducing the mutual inductances between the wire-bonds 416.

What is claimed is:

1. A filter assembly comprising:
   a ceramic substrate;
   a die including a film bulk acoustic resonator receive-band filter, positioned on the ceramic substrate, having an input and an output, and including a plurality of film bulk acoustic resonators;
   a first and a second loop of current, the first loop including a first wire bond connected to the input of the die, and a second wire bond connected to a first one of the plurality of film bulk acoustic resonators, the second loop including a third wire bond connected to the output of the die, and a fourth wire bond connected to a second one of the plurality of film bulk acoustic resonators, wherein the first loop induces parasitic current in the second loop; and
   wherein the first and the second wire bonds are positioned proximate to one another to minimize the area of the first loop, and the third and the fourth wire bonds are positioned proximate to one another to minimize the area of the second loop.

2. A filter assembly, as defined in claim 1, further comprising a first and a second wire bond pad in the first loop, interposing the respective wire bond and ceramic substrate, positioned proximate to one another to minimize mutual inductance.

3. A filter assembly, as defined in claim 2, further comprising a third and a fourth wire-bond pad in the second loop coupled to the third and the fourth wire-bond, respectively, the third and the fourth wire-bond pads being positioned proximate to one another.

4. A filter assembly, as defined in claim 3, wherein the wire-bond pads of the second loop are distal to the two wire-bond pads of the first loop.

5. A filter assembly, as defined in claim 3, wherein the first loop is perpendicular to the second loop.

6. The filter assembly of claim 1, and further comprising a metallic die attach layer positioned between the die and a top surface of the ceramic substrate, the die attach layer extending beyond an outer perimeter of the die.

7. The filter assembly of claim 6, and further comprising a metallic ground plane positioned on a bottom surface of the ceramic substrate and connected to the die attach layer by a plurality of metallic vias that extend through the ceramic substrate.

8. A filter assembly comprising:
   a filter chip including a plurality of film bulk acoustic resonators and having an input near a first edge of the chip and an output near a second opposing edge of the chip;
   a chip package;
   a first wire bond connected to the input and the chip package;
   a second wire bond coupled to a first one of the plurality of resonators, the second wire bond positioned substantially near the first wire bond;
   a third wire bond coupled to the output and the chip package;
   a fourth wire bond coupled to a second one of the plurality of resonators, the fourth wire bond positioned substantially near the third wire bond; and
   wherein the first wire bond and the second wire bond extend from the filter chip at substantially a 45 degree angle with respect to each other.

9. The filter assembly of claim 8, wherein the third wire bond and the fourth wire bond extend from the filter chip at substantially a 45 degree angle with respect to each other.

10. The filter assembly of claim 9, wherein the first wire bond and the third wire bond extend from the filter chip at substantially a 180 degree angle with respect to each other.

11. The filter assembly of claim 10, and further comprising:
    a fifth wire bond coupled to a third one of the plurality of resonators, the fifth wire bond positioned substantially perpendicular to the second wire bond.

12. The filter assembly of claim 11, and further comprising:
    a sixth wire bond coupled to a fourth one of the plurality of resonators and coupled to ground, the sixth wire bond positioned substantially perpendicular to the fourth wire bond.

13. The filter assembly of claim 8, wherein the plurality of resonators are in a ladder configuration, and wherein the first and the second resonators are shunt resonators in the ladder configuration.

14. The filter assembly of claim 13, wherein the first shunt resonator is connected to the input and is positioned substantially near a first corner of the filter chip, and wherein the second shunt resonator is connected to the output and is positioned substantially near a second corner of the filter chip, the second corner being an opposite corner of the first corner.

15. The filter assembly of claim 8, wherein the chip package includes a ceramic substrate and a metallic layer positioned between the filter chip and a top surface of the ceramic substrate, the metallic layer extending beyond an outer perimeter of the filter chip.

16. The filter assembly of claim 15, and further comprising a metallic ground plane positioned on a bottom surface of the ceramic substrate and connected to the metallic layer by a plurality of metallic vias that extend through the ceramic substrate.

17. The filter assembly of claim 8, wherein the filter chip is a receive-band filter chip.

18. A filter assembly comprising:
    a filter chip including a plurality of film bulk acoustic resonators and having an input near a first edge of the chip and an output near a second opposing edge of the chip;
    a chip package;
    a first wire bond connected to the input and the output and the chip package;
    a second wire bond coupled to a first one of the plurality of resonators, the second wire bond positioned substantially near the first wire bond;
    a third wire bond coupled to the output and the chip package;
    a fourth wire bond coupled to a second one of the plurality of resonators, the fourth wire bond positioned substantially near the third wire bond; and
    wherein the plurality of resonators are in a ladder configuration, and wherein the first and the second resonators are shunt resonators in the ladder configuration.

19. The further assembly of claim 18, wherein the first shunt resonator is connected to the input and is positioned substantially near a first corner of the filter chip, and wherein the second shunt resonator is connected to the output and is positioned substantially near a second corner of the filter chip, the second corner being an opposite corner of the first corner.

20. A filter assembly comprising:
    a ceramic substrate including a ground plane and a die-attach paddle electrically connected to the ground plane;
    a die including a film bulk acoustic resonator receive-band filter having a plurality of film bulk acoustic resonators, positioned on the die-attach paddle, having an input and an output;
    a first and a second loop of current, the first loop including the input of the die, the second loop including the output of the die, wherein the first loop induce parasitic current in the second loop; and
    two wire bonds in the first loop, electrically connecting the die to the substrate, wherein the two wire bonds are positioned proximate to one another to minimize mutual inductance.

21. The filter assembly of claim 20, wherein the die-attach paddle is positioned over a top surface of the ceramic substrate and extends beyond an outer perimeter of the die, and wherein the ground plane is positioned on a bottom surface of the ceramic substrate and is connected to the die-attach paddle with a plurality of metallic vias that extend through the ceramic substrate.

22. The filter assembly of claim 20, and further comprising:
    two wire bonds in the second loop, electrically connecting the die to the substrate, wherein the two wire bonds in the second loop are positioned proximate to one another and distal to the two wire bonds in the first loop.

* * * * *